United States Patent
Khaja et al.

(10) Patent No.: US 10,916,407 B2
(45) Date of Patent: Feb. 9, 2021

(54) CONDITIONING REMOTE PLASMA SOURCE FOR ENHANCED PERFORMANCE HAVING REPEATABLE ETCH AND DEPOSITION RATES

(71) Applicant: Applied Materials, Inc., Santa Clara, CA (US)

(72) Inventors: Abdul Aziz Khaja, San Jose, CA (US); Mohamad Ayoub, Los Gatos, CA (US); Jay D. Pinson, II, San Jose, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/180,784

(22) Filed: Nov. 5, 2018

(65) Prior Publication Data
US 2019/0074163 A1 Mar. 7, 2019

Related U.S. Application Data

(63) Continuation of application No. 14/694,676, filed on Apr. 23, 2015, now Pat. No. 10,192,717.
(Continued)

(51) Int. Cl.
*H01J 37/32* (2006.01)
*C23C 16/44* (2006.01)
*C23C 16/505* (2006.01)

(52) U.S. Cl.
CPC .... *H01J 37/32082* (2013.01); *C23C 16/4404* (2013.01); *C23C 16/4405* (2013.01);
(Continued)

(58) Field of Classification Search
CPC ........... H01J 37/32082; H01J 37/32357; H01J 37/3286; C23C 16/4404; C23C 16/4405; C23C 16/505
(Continued)

(56) References Cited

U.S. PATENT DOCUMENTS

| 5,756,222 | A | 5/1998 | Bercaw et al. |
| 5,858,464 | A * | 1/1999 | Littau ................. C23C 16/4401 427/237 |

(Continued)

FOREIGN PATENT DOCUMENTS

| CN | 101379213 A | 3/2009 |
| CN | 101440498 A | 5/2009 |

(Continued)

OTHER PUBLICATIONS

Chinese Search Report dated Dec. 5, 2018 for Application No. 201580039614.3.
(Continued)

*Primary Examiner* — Nadine G Norton
*Assistant Examiner* — Christopher Remavege
(74) *Attorney, Agent, or Firm* — Patterson + Sheridan, LLP

(57) ABSTRACT

Embodiments of the present disclosure generally relate to methods for conditioning an interior wall surface of a remote plasma generator. In one embodiment, a method for processing a substrate is provided. The method includes exposing an interior wall surface of a remote plasma source to a conditioning gas that is in excited state to passivate the interior wall surface of the remote plasma source, wherein the remote plasma source is coupled through a conduit to a processing chamber in which a substrate is disposed, and the conditioning gas comprises an oxygen-containing gas, a nitrogen-containing gas, or a combination thereof. The
(Continued)

method has been observed to be able to improve dissociation/recombination rate and plasma coupling efficiency in the processing chamber, and therefore provides repeatable and stable plasma source performance from wafer to wafer.

19 Claims, 2 Drawing Sheets

Related U.S. Application Data

(60) Provisional application No. 62/027,051, filed on Jul. 21, 2014.

(52) U.S. Cl.
CPC ...... *C23C 16/505* (2013.01); *H01J 37/32357* (2013.01); *H01J 37/32862* (2013.01)

(58) Field of Classification Search
USPC .......... 216/67, 58, 63, 68, 74; 438/788, 792, 438/905
See application file for complete search history.

(56) References Cited

U.S. PATENT DOCUMENTS

| | | | |
|---|---|---|---|
| 6,693,030 B1 | 2/2004 | Subrahmanyan et al. | |
| 6,872,323 B1 | 3/2005 | Entley et al. | |
| 7,234,476 B2 * | 6/2007 | Arai | B08B 7/0035 |
| | | | 134/1.1 |
| 7,967,913 B2 | 6/2011 | Hua et al. | |
| 7,989,365 B2 * | 8/2011 | Park | C23C 16/401 |
| | | | 257/E21.278 |
| 8,298,624 B2 | 10/2012 | Butcher et al. | |
| 8,551,891 B2 | 10/2013 | Liang et al. | |
| 8,580,354 B2 | 11/2013 | Fu et al. | |
| 8,742,665 B2 | 6/2014 | Lubomirsky et al. | |
| 2002/0066532 A1 | 6/2002 | Shih et al. | |
| 2005/0221020 A1 * | 10/2005 | Fukiage | H01L 21/02164 |
| | | | 427/569 |
| 2005/0250340 A1 * | 11/2005 | Chen | H01L 21/02274 |
| | | | 438/758 |
| 2005/0257890 A1 * | 11/2005 | Park | H01J 37/32192 |
| | | | 156/345.35 |
| 2007/0190266 A1 | 8/2007 | Fu | |
| 2007/0231992 A1 | 10/2007 | Balasubramaniam | |
| 2007/0235138 A1 | 10/2007 | Tsukamoto et al. | |
| 2008/0083701 A1 * | 4/2008 | Shao | H01J 37/32862 |
| | | | 216/58 |
| 2008/0087642 A1 | 4/2008 | Sawin et al. | |
| 2008/0216957 A1 * | 9/2008 | Ogasawara | B08B 7/0035 |
| | | | 156/345.29 |
| 2011/0005922 A1 | 1/2011 | Tai et al. | |
| 2011/0045676 A1 * | 2/2011 | Park | C23C 16/4404 |
| | | | 438/771 |
| 2011/0151677 A1 | 6/2011 | Wang et al. | |
| 2012/0040536 A1 | 2/2012 | Furuta et al. | |
| 2013/0048606 A1 | 2/2013 | Mao et al. | |
| 2013/0084711 A1 * | 4/2013 | Liang | C23C 16/345 |
| | | | 438/763 |
| 2014/0295665 A1 | 10/2014 | Zheng et al. | |
| 2014/0302254 A1 * | 10/2014 | Sang | C23C 16/4405 |
| | | | 427/539 |
| 2015/0000694 A1 * | 1/2015 | Zhu | C23C 16/4405 |
| | | | 134/1.1 |

FOREIGN PATENT DOCUMENTS

| | | |
|---|---|---|
| CN | 103526177 A | 1/2014 |
| TW | 201103377 A | 1/2011 |
| TW | 201323649 A | 6/2013 |

OTHER PUBLICATIONS

PCT Notification of Transmittal of the International Search Report and the Written Opinion of the International Searching Authority for International Application No. PCT/US2015/028352; dated Jul. 31, 2015; 10 total pages.
Taiwanese Office Action (with attached English translation of the Search Report) for Application No. 104115273; dated Jun. 28, 2019; 10 total pages.
Chinese Office Action dated Sep. 3, 2019 for Application No. 201580039614.3.
Taiwan Office Action dated Sep. 11, 2020 for Application No. 109105955.

* cited by examiner

CONDITIONING REMOTE PLASMA SOURCE FOR ENHANCED PERFORMANCE HAVING REPEATABLE ETCH AND DEPOSITION RATES

CROSS-REFERENCE TO RELATED APPLICATIONS

This application is a continuation of U.S. application Ser. No. 14/694,676 filed on Apr. 23, 2015, which claims priority to U.S. Provisional Patent Application Ser. No. 62/027,051, filed Jul. 21, 2014, both of which is herein incorporated by reference.

BACKGROUND

Field

Embodiments of the present disclosure generally relate to methods for conditioning remote plasma source.

Description of the Related Art

Plasma-enhanced chemical vapor deposition (PECVD) process is a process where electro-magnetic energy is applied to at least one precursor gas or vapor to transform the precursor into a reactive plasma. Forming a plasma can lower the temperature required to form a film, increase the rate of formation, or both. Plasma may be generated inside the processing chamber, i.e., in situ, or in a remote plasma generator that is remotely positioned from the processing chamber. Remote plasma generators offer several advantages. For example, the remote plasma generator provides a plasma capability to a deposition system that does not have an in situ plasma system. The use of the remote plasma generator also minimizes the plasma interaction with the substrate and chamber components, thereby preventing the interior of the processing chamber from undesirable by-products of the plasma formation process.

Remote plasma generators generally have a protective anodized aluminum coating to protect the aluminum interior walls from degradation. However, anodized aluminum coatings are usually porous and prone to surface reactions. Therefore, the lifetime of anodized aluminum coatings is limited due to the degradation of the anodized coating in the plasma cleaning environment. Failure of the protective anodized coating over an aluminum surface leads to excessive particulate generation within the downstream reactor chamber. In addition, the downstream reactor chamber also suffers unstable plasma performance due to change in surface condition of the protective anodized coating as the process continues. Therefore, the wafer deposition/etch rates, film uniformity and plasma coupling efficiency from wafer to wafer are degraded.

While a frequent chamber cleaning may be performed to stabilize the chamber conditions, the chamber cleaning chemistries such as $NF_3$ will degrade the anodized coating to degrade at much faster rate. In some cases where the remote plasma source uses an AlN plasma block or anodized plasma block, the surface condition inside the remote plasma source will change over time with deposition or clean chemistries. This change in surface condition of the plasma block does not provide repeatable plasma performance resulting in inconsistent wafer-to-wafer performance over time.

Therefore, there is a need for methods for conditioning the surface of the remote plasma generator to provide stable and repeatable plasma performance while maintaining the substrate throughput.

SUMMARY

Embodiments of the present disclosure generally relate to methods for conditioning an interior wall surface of a remote plasma generator. In one embodiment, a method for processing a substrate is provided. The method includes exposing an interior wall surface of a radical source to a conditioning gas that is in excited state to passivate the interior wall surface of the radical source, wherein the radical source is coupled through a radical conduit to a processing chamber in which a substrate is disposed, and the conditioning gas comprises an oxygen-containing gas, a nitrogen-containing gas, or a combination thereof.

In another embodiment, the method includes (a) exposing an interior wall surface of a radical source to a conditioning gas that is in excited state to passivate the interior wall surface of the radical source, wherein the radical source is coupled through a radical conduit to a processing chamber in which a substrate is disposed, and the conditioning gas comprises an oxygen-containing gas, a nitrogen-containing gas, or a combination thereof, (b) performing a series of processes on N number of substrates from a batch of substrates in the processing chamber using radicals from the radical source, where N is an integral number of substrates between 1 and 20, and (c) repeating (a) and (b) until the last substrate in the batch of the substrates is processed and removed from the processing chamber.

In yet another embodiment, the method includes exposing an interior wall surface of a radical source to a conditioning gas, wherein the conditioning gas comprises an oxygen-containing gas, a nitrogen-containing gas, or a combination thereof, generating a plasma from the conditioning gas in the radical source to passivate the interior wall surface of the radical source, and performing a series of processes on N number of substrates in the processing chamber using radicals from the radical source, where N is an integral number of substrates between 1 and 20.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
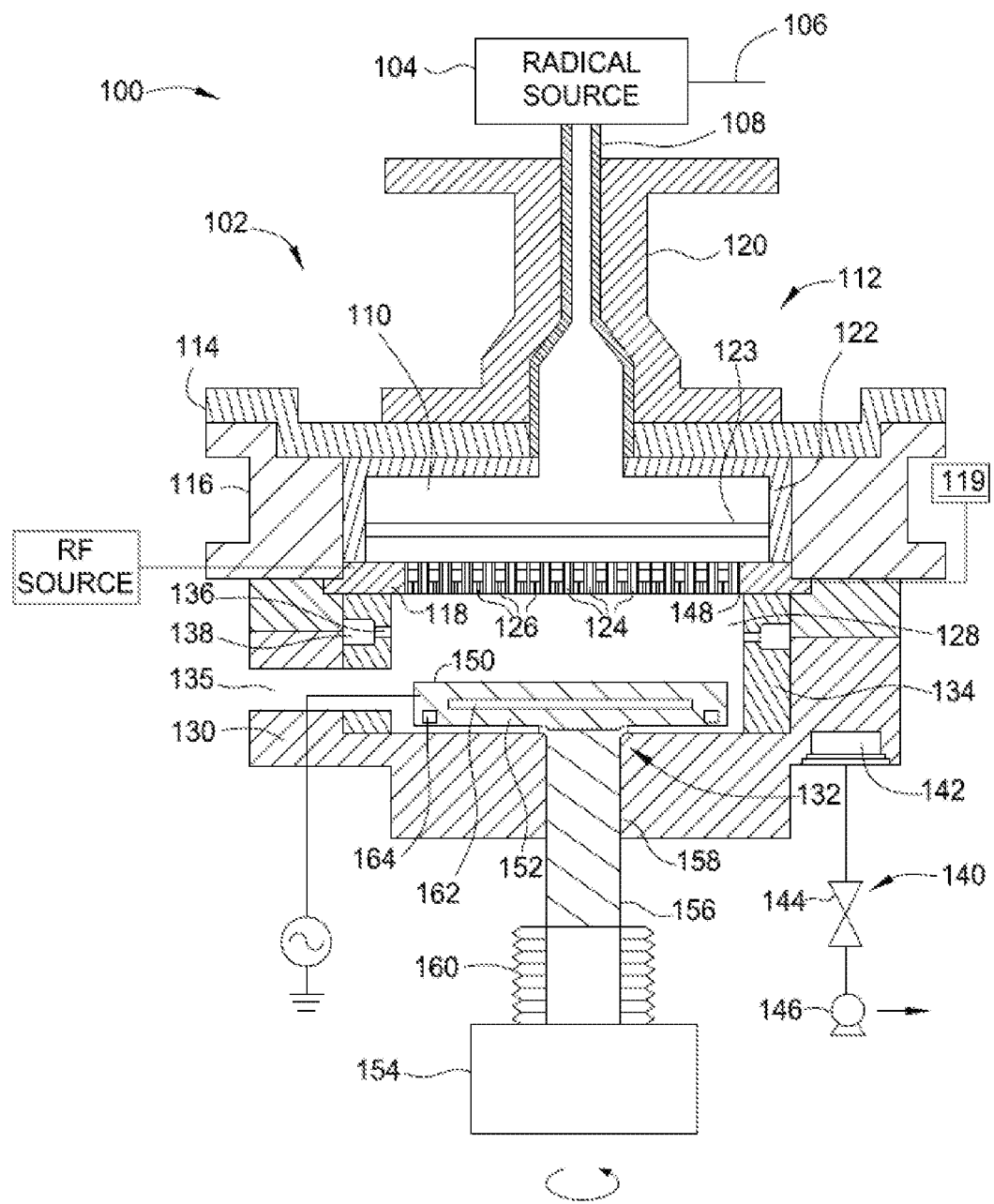
FIG. 1 is a cross-sectional view of an apparatus for forming dielectric films according to embodiments of the present disclosure.

FIG. 1 is a cross-sectional view of an apparatus 100 for forming dielectric films according to embodiments of the present disclosure. In one embodiment, the apparatus 100 includes a processing chamber 102 and a radical source 104 coupled to the processing chamber 102. The radical source 104 may be any suitable source that is capable of generating radicals. The radical source 104 may be a remote plasma source, such as a radio frequency (RF) or very high radio frequency (VHRF) capacitively coupled plasma (CCP) source, an inductively coupled plasma (ICP) source, a microwave induced (MW) plasma source, an electron cyclotron resonance (ECR) chamber, or a high density plasma (HDP) chamber. Alternatively, the radical source 104 may be an ultraviolet (UV) source or the filament of a hot wire chemical vapor deposition (HW-CVD) chamber. The radical source 104 may include one or more gas inlets 106 and the radical source 104 may be coupled to the processing chamber 102 by a radical conduit 108. One or more process gases, which may be radical-forming gases, may enter the radical source 104 via the one or more gas inlets 106. The one or more process gases may comprise an oxygen-containing gas, a nitrogen-containing gas, a hydrogen containing gas, or any combination thereof. Radicals generated in the radical source 104 travel into the processing chamber 102 through the radical conduit 108 coupling to the processing chamber 102.

The radical source 104 may have an anodized coating applied to the aluminum interior chamber walls to protect the underlying aluminum interior chamber walls from corrosion or degradation. In various embodiments, the anodized protective coating is formed from aluminum oxide or aluminum nitride.

The radical conduit 108 is a part of a lid assembly 112, which also includes a radical cavity 110, a top plate 114, a lid rim 116, and a dual-zone showerhead 118. The radical conduit 108 may comprise a material that is substantially nonreactive to radicals. For example, radical conduit 108 may comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. A representative example of a suitable $SiO_2$ material is quartz. Alternatively or additionally, radical conduit 108 may have a coating on the surface that contacts the radicals in operation. The coating may also comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. If a coating is used, the thickness of the coating may be between about 1 μm and about 1 mm. The coating may be applied using a spray coating process. The radical conduit 108 may be disposed within and supported by a radical conduit support member 120. The radical conduit support member 120 may be disposed on the top plate 114, which rests on the lid rim 116.

The radical cavity 110 is positioned below and coupled to the radical conduit 108, and the radicals generated in the radical source 104 travel to the radical cavity 110 through the radical conduit 108. The radical cavity 110 is defined by the top plate 114, the lid rim 116 and the dual-zone showerhead 118. Optionally, the radical cavity 110 may include a liner 122. The liner 122 may cover surfaces of the top plate 114 and the lid rim 116 that are within the radical cavity 110. The liner 122 may comprise a material that is substantially nonreactive to radicals. For example, the liner 122 may comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. Alternatively or in addition to, the surfaces of the radical cavity 110 that are in contact with radicals may be composed of or coated with a material that is substantially nonreactive to radicals. For example, the surfaces may be composed of or coated with AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. If a coating is used, the thickness of the coating may be between about 1 μm and about 1 mm. By not consuming the generated radicals, the radical flux to a substrate disposed in the processing chamber 102 is increased.

An ion filter 123 may be disposed in the radical cavity 110 between the top plate 114 and the dual-zone showerhead 118. The ion filter 123 may be a perforated plate that is electrically grounded. If the radicals are generated within a plasma, the ions, electrons, and ultraviolet radiation generated in the plasma may be blocked by the ion filter 123 in order to direct only radicals to the dual-zone showerhead 118 and to prevent damage to the deposited film. Ion filter 123 can also control the number of radicals that pass through. Radicals then pass through a plurality of tubes 124 disposed in the dual-zone showerhead 118 to enter into a processing region 128. The dual-zone showerhead 118 further includes a plurality of openings 126 that are smaller in diameter than the plurality of tubes 124. The plurality of openings 126 are connected to an internal volume (not shown) that is not in fluid communication with the plurality of tubes 124. One or more fluid sources 119 may be coupled to the dual-zone showerhead 118 for introducing a fluid mixture into a processing region 128 of the processing chamber 102. The fluid mixture may include precursor, porogen, and/or carrier fluids. The fluid mixture may be a mixture of gases and liquids.

The processing chamber 102 may include the lid assembly 112, a chamber body 130 and a support assembly 132. The support assembly 132 may be at least partially disposed within the chamber body 130. The chamber body 130 may include a slit valve 135 to provide access to the interior of the processing chamber 102. The chamber body 130 may include a liner 134 that covers the interior surfaces of the chamber body 130. The liner 134 may include one or more apertures 136 and a pumping channel 138 formed therein that is in fluid communication with a vacuum system 140. The apertures 136 provide a flow path for gases into the pumping channel 138, which provides an egress for the gases within the processing chamber 102.

The vacuum system 140 may include a vacuum port 142, a valve 144 and a vacuum pump 146. The vacuum pump 146 is in fluid communication with the pumping channel 138 via the vacuum port 142. The apertures 136 allow the pumping channel 138 to be in fluid communication with the processing region 128 within the chamber body 130. The processing region 128 is defined by a lower surface 148 of the dual-zone showerhead 118 and an upper surface 150 of the support assembly 132, and the processing region 128 is surrounded by the liner 134.

The support assembly 132 may include a support member 152 to support a substrate (not shown) for processing within the chamber body 130. The substrate may be any standard wafer size, such as, for example, 300 mm. Alternatively, the substrate may be larger than 300 mm, such as 450 mm or larger. The support member 152 may comprise aluminum nitride (AlN) or aluminum depending on operating temperature. The support member 152 may be configured to chuck the substrate and the support member 152 may be an electrostatic chuck or a vacuum chuck.

The support member 152 may be coupled to a lift mechanism 154 through a shaft 156 which extends through a centrally-located opening 158 formed in a bottom surface of the chamber body 130. The lift mechanism 154 may be flexibly sealed to the chamber body 130 by bellows 160 that prevents vacuum leakage from around the shaft 156. The lift mechanism 154 allows the support member 152 to be moved vertically within the chamber body 130 between a process position and a lower, transfer position. The transfer position is slightly below the opening of the slit valve 135. During operation, the spacing between the substrate and the dual-zone showerhead 118 may be minimized in order to maximize radical flux at the substrate surface. For example, the spacing may be between about 100 mm and about 5,000 mm. The lift mechanism 154 may be capable of rotating the shaft 156, which in turn rotates the support member 152, causing the substrate disposed on the support member 152 to be rotated during operation.

One or more heating elements 162 and a cooling channel 164 may be embedded in the support member 152. The heating elements 162 and cooling channel 164 may be used to control the temperature of the substrate during operation. The heating elements 162 may be any suitable heating elements, such as one or more resistive heating elements. The heating elements 162 may be connected to one or more power sources (not shown). The heating elements 162 may be controlled individually to have independent heating and/or cooling control on multi-zone heating or cooling. With the ability to have independent control on multi-zone heating and cooling, the substrate temperature profile can be enhanced at any giving process conditions. A coolant may flow through the channel 164 to cool the substrate. The support member 152 may further include gas passages extending to the upper surface 150 for flowing a cooling gas to the backside of the substrate.

An RF source may be coupled to either the dual-zone showerhead 118 or the support member 152. The RF source may be low frequency, high frequency, or very high frequency. In one embodiment, the dual-zone showerhead 118 is coupled to the RF source and the support member 152 is grounded, as shown in FIG. 1. In another embodiment, the dual-zone showerhead 118 is grounded and the support member 152 is coupled to the RF source. In either embodiment, a capacitively coupled plasma may be formed in the processing region 128 between the dual-zone showerhead 118 and the support member 152 during operation. The capacitively coupled plasma formed in the processing region 128 is in addition to the plasma formed in the radical source when the radical source is a remote plasma source. The support member 152 may be biased with a DC source to increase ion bombardment.

Figure 2:
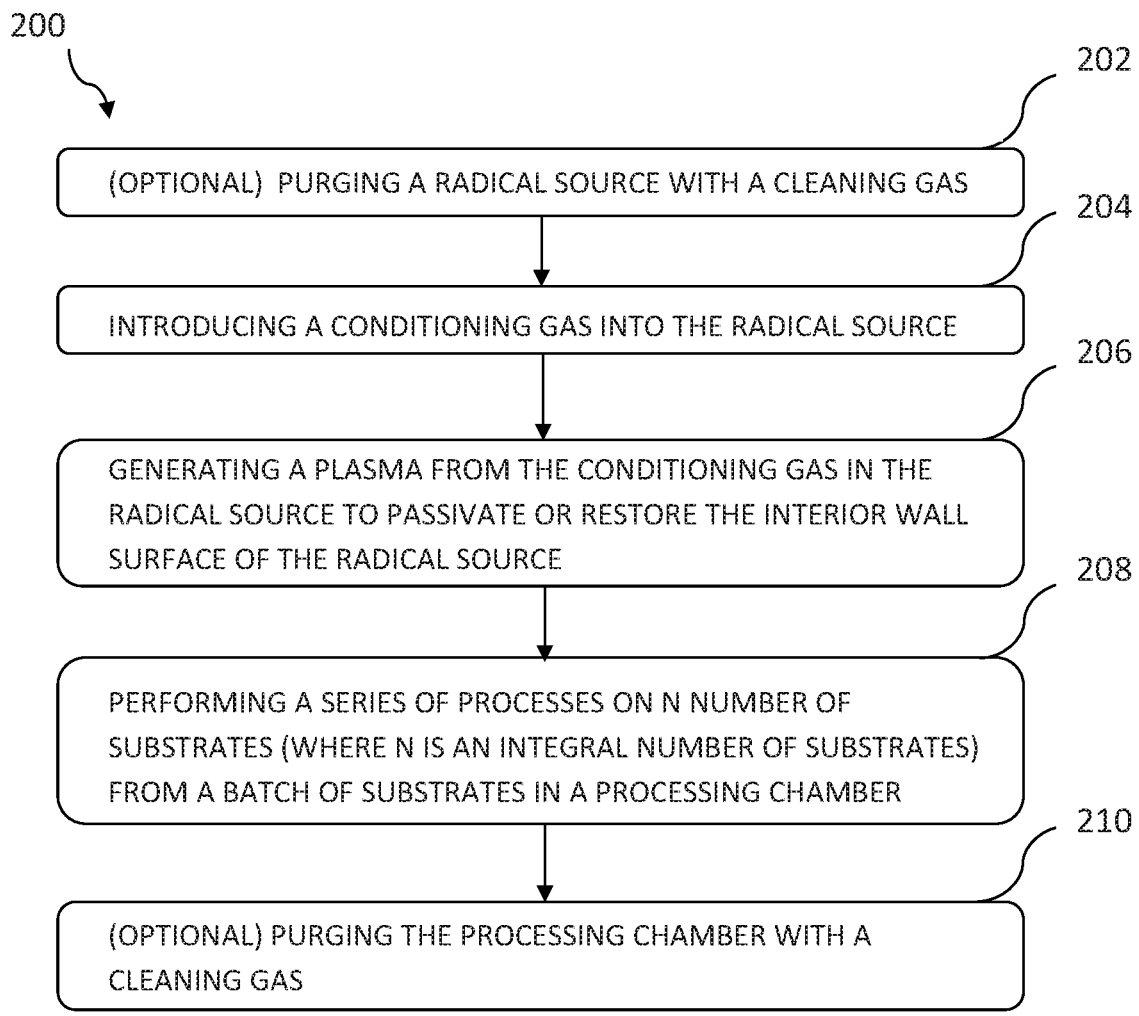
FIG. 2 illustrates a method for conditioning a radical source of FIG. 1 according to embodiments of the present disclosure.

FIG. 2 illustrates a method 200 for conditioning the radical source 104 of FIG. 1 according to embodiments of the present disclosure. It should be noted that the method 200 may be applicable to any remote plasma source that is positioned remotely from the processing chamber in which a substrate is disposed. The method 200 may be performed before, during, or after processing of each substrate (e.g., deposition or etch process) in the processing chamber. In some embodiments, the method 200 may be performed periodically after a predetermined number of substrates, such as about 2 to about 15 substrates, have been processed. In such a case, the method 200 may be performed without the substrate being presented in the processing chamber. It should be noted that the sequence of steps illustrated in FIG. 2 are not intended to be limiting as to the scope of the disclosure described herein, since one or more steps may be added, deleted and/or reordered without deviating from the basic scope of the disclosure.

At block 202, the radical source 104 is optionally purged with a cleaning gas. The cleaning gas may be introduced into the radical source 104 from a cleaning gas source through one or more gas inlets 106. The cleaning gas may be thermally activated and/or plasma-assisted under process conditions suitable to effectively remove any unwanted debits or by-products from the radical source 104. Exemplary cleaning gas may include, but is not limited to $NF_3$, $NH_3$, $F_2$, $CF_4$, $C_2F_6$, $C_4F_8$, $SF_6$, $CHF_3$, $CF_6$, $H_2$, $CCl_4$, $C_2Cl_6$, or any combination thereof. Optionally, the cleaning gas may further include an inert gas, such as argon or helium. In some embodiments, the cleaning gas may be introduced into the radical source 104 along with a conditioning gas, as will be described below at block 204. In some embodiments, the above cleaning process may be performed in the processing chamber 102. The cleaning process may be performed for about 3 seconds to about 300 seconds, depending upon the number of substrates processed in the processing chamber between each cleaning.

At block 204, a conditioning gas is introduced into the radical source 104 from a conditioning gas source through one or more gas inlets 106. In various embodiments, the conditioning gas may include an oxygen-containing gas, a nitrogen-containing gas, or a combination thereof. Exemplary oxygen-containing gas may include, but is not limited to, one or more of the following: oxygen ($O_2$) gas, ozone ($O_3$) gas, nitrous oxide ($N_2O$), nitrogen monoxide (NO), carbon monoxide (CO), carbon dioxide ($CO_2$), water vapor ($H_2O$), or any combination thereof. Exemplary nitrogen-containing gas may include, but is not limited to, one or more of the following: ammonia ($NH_3$), nitrogen ($N_2$), hydrazine ($N_2H_4$), nitric oxide (NO), nitrous oxide ($N_2O$), or nitrogen dioxide ($NO_2$), or any combination thereof. The use of a conditioning gas containing oxygen-containing gas may be advantageous if the anodized protective coating of the radical source 104 is aluminum oxide. The use of a conditioning gas containing nitrogen-containing gas may be advantageous if the anodized protective coating of the radical source 104 is aluminum nitride. In some embodiments, a conditioning gas comprising a oxygen-containing gas may be used in cases where the anodized protective coating of the radical source 104 is aluminum nitride. In some embodiments, a conditioning gas comprising a nitrogen-containing gas may be used in cases where the anodized protective coating of the radical source 104 is aluminum oxide.

A chemically inert gas, such as helium gas, nitrogen gas, or argon gas, may be flowed into the processing chamber with the conditioning gas. If an inert gas is used, the inert gas may be introduced at an inert gas to conditioning gas ratio of about 1:1 to about 1:20, such as about 1:6 to about 1:15, for example about 1:10. In one embodiment, the conditioning gas may be introduced into the radical source 104 at a flow rate between about 2000 sccm and about 20000 sccm and at a chamber pressure of about 0.1 Torr to about 20 Torr.

At block 206, a plasma is generated from the conditioning gas in the radical source 104 to passivate or restore the interior wall surface of the radical source 104. In some embodiments, instead of striking the plasma within the radical source 104, a conditioning gas in an excited state may be flowed into the radical source 104 from a remote plasma source that is separate from the radical source. The term "excited state" used herein refers to a gas wherein at least some of the gas molecules are in vibrationally-excited, dissociated and/or ionized states. Alternatively, the passivation of the interior wall surface of the radical source 104 may be performed using a plasma-free process. That is, the conditioning gas is introduced into the radical source 104 and excited or dissociated at an elevated temperature suitable for thermal decomposition of the conditioning gas.

In case the radical source 104 is a capacitively coupled plasma (CCP) type source, the radical source 104 may be maintained at a pressure of about 0.1 Torr to about 20 Torr, for example about 1 Torr to about 10 Torr, and a temperature of about 250° C. to about 400° C. during the passivation. If the conditioning gas is dissociated using a RF power, the RF power density supplied to the radical source 104 may be between about 0.001 W/cm$^2$ to about 5 W/cm$^2$, such as from about 0.01 W/cm$^2$ to about 1 W/cm$^2$, for example about 0.04 W/cm$^2$ to about 0.07 W/cm$^2$.

The processing time for the passivation of the interior wall surface of the radical source 104 may vary depending upon the number of the substrates processed (i.e., substrate process time) and/or the duration of the process (e.g., deposition or etch process) performed on the substrate within the processing chamber 102 (i.e., substrate process time) between each passivation process. In most cases, the passivation process time may be between about 2 seconds and about 30 seconds, such as about 3 seconds to about 25 seconds, for example about 10 seconds. In various embodiments, the passivation process time and the substrate process time may be at a ratio of about 1:5 to about 1:30, such as about 1:8 to about 1:20, for example about 1:12.

At block 208, once the interior wall surface of the radical source 104 has been passivated or restored, a series of processes are performed on N number of substrates (where N is an integral number of substrates) from a batch of substrates in the downstream processing chamber, e.g., the processing chamber 102 of FIG. 1. In one embodiment, the N ranges between 1 and 20 substrates, such as between about 3 substrates and about 10 substrates, for example about 5 substrates. The process may be any deposition and/or etch process used to deposit or etch, for example, oxide or nitride materials, silicon-containing materials, or carbon-containing materials, either doped or undoped. The deposition and/or etch process may use radicals from the radical source. In one example, the deposition process is a flowable chemical vapor deposition (CVD) using silicon-containing precursor and NH$_3$/O$_2$/N$_2$/H$_2$ oxidizer chemistries to deposit dielectric materials. During deposition or etch process, an oxygen-containing gas and/or a nitrogen-containing gas may be flowed into the radical source 104 to stabilize the plasma.

At block 210, after the series of deposition/etch processes are performed, an interior wall surface of the processing chamber 102 may be optionally purged using a cleaning process. The cleaning process can be the same cleaning process described above with respect with block 202. In one example, the processing chamber 102 is cleaned using a cleaning gas comprising NF$_3$, ammonia, or a combination of thereof. During the cleaning of the processing chamber 102, an oxygen-containing gas, such as the oxygen-containing gas described above with respect to block 204, may be flowed into the radical source 104 for conditioning the interior wall surface of the radical source 104.

During cleaning, the cleaning gas may be introduced into the processing chamber 102 at a flow rate between about 2000 sccm and about 20000 sccm. The processing chamber 102 may be maintained at a pressure of about 0.1 Torr to about 20 Torr. A RF power, if used, may be supplied to the processing chamber 102 at a density of about 0.001 W/cm$^2$ to about 5 W/cm$^2$, such as from about 0.01 W/cm$^2$ to about 1 W/cm$^2$, for example about 0.04 W/cm$^2$ to about 0.07 W/cm$^2$, to activate the cleaning gas.

The processes described at blocks 202-210 may be repeated until the last substrate in the batch of the substrates is finished with the process and removed from the processing chamber 102.

Various processes are contemplated and may be added to the method 200. In some embodiments, a seasoning process may be optionally performed before the deposition or etch process (i.e., before block 208) or after the processing chamber 102 has been cleaned (i.e., after block 210) to deposit a seasoning layer on the walls of the cleaned processing chamber 102. In such a case, the passivation process as described at blocks 204 and 206 may be performed immediately before and/or after the seasoning process. The protective layer may vary depending upon the process to be performed in the processing chamber 102. For example, if a nitrogen-containing layer is to be deposited on the substrate, a seasoning layer of silicon nitride may be deposited onto the chamber surface of the processing chamber 102. The seasoning layer acts as a glue layer so that the subsequently deposited nitrogen-containing materials tend to adhere thereto better than to the interior chamber surface of the processing chamber 102. Therefore, residual nitrogen-containing materials are less likely to become dislodged during substrate processing. The seasoning process may be carried out with no substrate in the processing chamber 102. Alternatively, a sacrificial (dummy) substrate may be placed in the processing chamber 102 during the seasoning process.

In cases where the cleaning process is performed in the processing chamber 102 after the deposition/etch process, an optional conditioning process may be performed to remove undesirable fluorine (F) or nitrogen (N) containing contaminants from the cleaning process that are bonded to, or adsorbed on, the chamber surfaces of the processing chamber 102. In one embodiment, a hydrogen-containing plasma may be generated in the processing chamber 102 by flowing 1200 sccm of hydrogen into the processing chamber 102 for 30 seconds, creating a plasma using 300 Watts of power. The hydrogen plasma reacts with the fluorine present in the processing chamber 102 and forms a volatile HF containing vapor that is readily removable via the chamber exhaust. The processing chamber 102 may be maintained at the temperature to be used for subsequent deposition/etch process, and a pressure of about 1-10 Torr. The electrode spacing between the showerhead 118 and the support assembly 132 may be about 800-1500 mils.

Benefits of the present disclosure provide methods for passivating or restoring an interior wall surface of a remote plasma generator by exposing the interior wall surface to a plasma formed from a conditioning gas comprising an oxygen-containing gas, a nitrogen-containing gas, or a combination thereof. The inventive process restores and stabilizes the surface condition of the interior wall surface of the remote plasma source. Therefore, the lifetime of the protective anodized aluminum coating is improved even in the plasma cleaning environment, which leads to minimized particulate generation within the downstream reactor chamber. The inventive process thus results in improved deposition rate, improved deposition uniformity and plasma coupling efficiency in the processing chamber during subsequent deposition. As a result, a repeatable and stable plasma source performance from wafer to wafer is obtained.

While a frequent chamber cleaning may be performed to stabilize the chamber conditions, the chamber cleaning chemistries such as NF$_3$ will degrade the anodized coating to degrade at much faster rate. In some cases where the remote plasma source uses an AlN plasma block or anodized plasma block, the surface condition inside the remote plasma source will change over time with deposition or clean chemistries. This change in surface condition of the plasma block does not provide repeatable plasma performance resulting in inconsistent wafer-to-wafer performance over time While the foregoing is directed to embodiments of the present disclosure, other and further embodiments of the disclosure may be devised without departing from the basic scope thereof, and the scope thereof is determined by the claims that follow.

What is claimed is:

1. A method for processing a substrate, comprising:
   exposing an interior wall surface of a remote plasma source comprising aluminum oxide or aluminum nitride to a conditioning gas that is in an excited state to passivate the interior wall surface of the remote plasma source, the passivating the interior wall surface comprising restoring the aluminum oxide or the aluminum nitride of the interior wall surface, the conditioning gas comprising an oxygen-containing gas when the interior wall surface comprises aluminum oxide, the conditioning gas comprising a nitrogen-containing gas when the interior wall surface comprises aluminum nitride, wherein the oxygen-containing gas comprises oxygen ($O_2$) gas, ozone ($O_3$) gas, nitrous oxide ($N_2O$), nitrogen monoxide (NO), carbon monoxide (CO), carbon dioxide ($CO_2$), water vapor ($H_2O$), or any combination thereof and the nitrogen containing gas comprises ammonia ($NH_3$), nitrogen ($N_2$), hydrazine ($N_2H_4$), nitric oxide (NO), nitrous oxide ($N_2O$), or nitrogen dioxide ($NO_2$), or any combination thereof, and the remote plasma source coupled to a processing chamber and exposed to the conditioning gas for a passivation process time;
   after passivating the interior wall surface of the remote plasma source with the conditioning gas, performing a series of deposition or etch processes on N number of substrates in the processing chamber using process radicals generated in the remote plasma source, the series of deposition or etch processes performed on the N number of substrates for a substrate process time such that a ratio of the passivation process time to the substrate process time is about 1:5 to about 1:30; and
   repeating the exposing the interior wall surface of the remote plasma source to the conditioning gas, the generating the plasma from the conditioning gas, and the performing the series of deposition or etch processes on subsequent batches of N number of substrates.

2. The method of claim 1, wherein the conditioning gas consists essentially of the oxygen-containing gas or the nitrogen-containing gas and a chemically inert gas, wherein the chemically inert gas is at an inert gas to conditioning gas ratio of about 1:6 to about 1:15.

3. The method of claim 1, wherein N is an integral number of substrates between 1 and 20.

4. The method of claim 1, further comprising:
   before exposing an interior wall surface of a remote plasma source to a conditioning gas, exposing an interior wall surface of the processing chamber to a cleaning gas, wherein the cleaning gas comprises $NF_3$, $NH_3$, $F_2$, $CF_4$, $C_2F_6$, $C_4F_8$, $SF_6$, $CHF_3$, $CF_6$, $H_2$, $CCl_4$, $C_2Cl_6$, or any combination thereof.

5. The method of claim 4, further comprising:
   exposing the interior wall surface of the remote plasma source to an oxygen-containing gas during cleaning of the processing chamber.

6. A method for processing a substrate, comprising:
   (a) exposing an interior wall surface comprising aluminum oxide or aluminum nitride of a remote plasma source to a conditioning gas that is in an excited state to passivate the interior wall surface of the remote plasma source, the passivating the interior wall surface comprising restoring the aluminum oxide or the aluminum nitride of the interior wall surface, the remote plasma source coupled to a processing chamber, and the conditioning gas consisting essentially of an oxygen-containing gas from the list of oxygen ($O_2$) gas, ozone ($O_3$) gas, nitrous oxide ($N_2O$), nitrogen monoxide (NO), carbon monoxide (CO), carbon dioxide ($CO_2$), water vapor ($H_2O$), or any combination thereof when the interior wall surface comprises aluminum oxide or a nitrogen-containing gas from the list of ammonia ($NH_3$), nitrogen ($N_2$), hydrazine ($N_2H_4$), nitric oxide (NO), nitrous oxide ($N_2O$), or nitrogen dioxide ($NO_2$), or any combination thereof when the interior wall surface comprises aluminum nitride, the remote plasma source exposed to the conditioning gas for a passivation process time;
   (b) after passivating the interior wall surface of the remote plasma source with the conditioning gas, performing a series of deposition or etch processes on N number of substrates from a batch of substrates in the processing chamber using process radicals generated in the remote plasma source for a substrate process time; and
   (c) repeating (a) and (b) until a last substrate in the batch of the substrates is processed and removed from the processing chamber, wherein a ratio of the passivation process time to the substrate process time is about 1:5 to about 1:30.

7. The method of claim 6, further comprising:
   before (a), exposing an interior wall surface of the processing chamber to a cleaning gas, wherein the cleaning gas comprises $NF_3$, $NH_3$, $F_2$, $CF_4$, $C_2F_6$, $C_4F_8$, $SF_6$, $CHF_3$, $CF_6$, $H_2$, $CCl_4$, $C_2Cl_6$, or any combination thereof.

8. The method of claim 7, further comprising:
   exposing the interior wall surface of the remote plasma source to an oxygen-containing gas during cleaning of the processing chamber.

9. The method of claim 6, further comprising:
   after (b), exposing an interior wall surface of the processing chamber to a cleaning gas, wherein the cleaning gas comprises $NF_3$, $NH_3$, $F_2$, $CF_4$, $C_2F_6$, $C_4F_8$, $SF_6$, $CHF_3$, $CF_6$, $H_2$, $CCl_4$, $C_2Cl_6$, or any combination thereof.

10. The method of claim 9, further comprising:
    exposing the interior wall surface of the remote plasma source to an oxygen-containing gas during cleaning of the processing chamber.

11. The method of claim 6, wherein a passivation time of the interior wall surface of the remote plasma source and a processing time for performing the series of deposition or etch processes on N number of substrates are at a ratio of about 1:5 to about 1:30.

12. The method of claim 6, wherein the conditioning gas further comprises a chemically inert gas, and the inert gas is at an inert gas to conditioning gas ratio of about 1:6 to about 1:15.

13. The method of claim 6, wherein the conditioning gas is excited by an RF power or thermally excited in the remote plasma source, or excited by an RF power or thermally excited in a radical source that is separated from the remote plasma source.

14. A method for processing a substrate, comprising:

exposing an interior wall surface comprising aluminum nitride of a remote plasma source to a conditioning gas, the conditioning gas comprising a nitrogen-containing gas, the nitrogen containing gas consists essentially of any one or a combination of ammonia ($NH_3$), nitrogen ($N_2$), hydrazine ($N_2H_4$), nitric oxide (NO), nitrous oxide ($N_2O$), or nitrogen dioxide ($NO_2$), the remote plasma source being coupled to a processing chamber;

generating a plasma from the conditioning gas in the remote plasma source to passivate the interior wall surface of the remote plasma source, the passivating the interior wall surface comprising restoring the aluminum nitride of the interior wall surface; and after passivating the interior wall surface of the remote plasma source with the conditioning gas, performing a series of deposition or etch processes on a first batch of substrates comprising N number of substrates in the processing chamber using process radicals generated in the remote plasma source; and repeating the exposing the interior wall surface of the remote plasma source to the conditioning gas, the generating the plasma from the conditioning gas, and the performing the series of deposition or etch processes on subsequent batches of N number of substrates, wherein a passivation time of the interior wall surface of the remote plasma source and a processing time for performing a series of deposition or etch processes on N number of substrates are at a ratio of about 1:5 to about 1:30 and N is an integral number of substrates between 1 and 20.

15. The method of claim 14, wherein the conditioning gas consists essentially of the nitrogen containing gas and a chemically inert gas and the inert gas to conditioning gas ratio is about 1:6 to about 1:15.

16. The method of claim 14, further comprising:

exposing the interior wall surface of the processing chamber to a cleaning gas, wherein the cleaning gas comprises $NF_3$, $NH_3$, $F_2$, $CF_4$, $C_2F_6$, $C_4F_8$, $SF_6$, $CHF_3$, $CF_6$, $H_2$, $CCl_4$, $C_2Cl_6$, or any combination thereof and the exposing the interior wall surface of the processing chamber to the cleaning gas for about 3 second to about 300 seconds, the cleaning gas being introduced at a flow rate of between about 2000 sccm and about 20000 sccm;

maintaining the inside of the remote plasma source at a pressure of about 0.1 Torr to about 20 Torr and at a temperature of about 250° C. to about 400° C. during the passivation of the interior wall surface of the remote plasma source; and applying a radio frequency power with a density of about 0.001 W/cm$^2$ to about 5 W/cm$^2$ to the remote plasma source during the passivation of the interior wall surface of the remote plasma source.

17. The method of claim 16, further comprising:

exposing the interior wall surface of the remote plasma source to an oxygen-containing gas during cleaning of the processing chamber.

18. The method of claim 1, further comprising, after passivating the interior wall surface of the remote plasma source, forming a seasoning layer onto a chamber surface of the processing chamber without the presence of a substrate.

19. The method of claim 6, further comprising, after passivating the interior wall surface of the remote plasma source, forming a seasoning layer containing silicon nitride onto a chamber surface of the processing chamber without the presence of a substrate.

* * * * *